United States Patent [19]

Butler

[11] Patent Number: 5,104,822
[45] Date of Patent: Apr. 14, 1992

[54] METHOD FOR CREATING SELF-ALIGNED, NON-PATTERNED CONTACT AREAS AND STACKED CAPACITORS USING THE METHOD

[75] Inventor: Douglas B. Butler, Colorado Springs, Colo.

[73] Assignees: Ramtron Corporation, Colorado Springs, Colo.; NMB Semiconductor Company, Ltd., Japan

[21] Appl. No.: 559,466

[22] Filed: Jul. 30, 1990

[51] Int. Cl.$^5$ .................... H01L 21/72; H01L 27/108
[52] U.S. Cl. ........................................ 437/52; 437/60; 437/193; 437/919
[58] Field of Search ................ 437/47, 48, 52, 60, 437/919, 193; 357/23.6; 148/DIG. 14

[56] References Cited

U.S. PATENT DOCUMENTS

| | | | |
|---|---|---|---|
| 4,123,300 | 10/1978 | Joshi et al. | 437/47 |
| 4,513,304 | 4/1985 | Takemae | 357/23.6 |
| 4,570,331 | 2/1986 | Eaton, Jr. et al. | 437/52 |
| 4,685,197 | 8/1987 | Tigelaar et al. | 357/23.6 |
| 4,686,000 | 8/1987 | Heath | 156/643 |
| 4,688,063 | 8/1987 | Lu et al. | 357/23.6 |
| 4,700,457 | 10/1987 | Matsukawa | 437/52 |
| 4,704,705 | 11/1987 | Womack | 357/23.6 |
| 4,721,987 | 1/1988 | Baglee et al. | 357/23.6 |
| 4,804,636 | 2/1989 | Groover, III et al. | 437/52 |
| 4,899,203 | 2/1990 | Ino | 357/23.6 |
| 4,918,503 | 4/1990 | Okuyama | 357/23.6 |

FOREIGN PATENT DOCUMENTS 63-72150 4/1988 Japan.

OTHER PUBLICATIONS

"3 Dimensional Stacked Capacitor Cell for 16M and 64M Drams", Ema et al., *IEDM*, 1988, pp. 592-595.
"Double Stacked Capacitor with Self-Aligned Poly Source/Drain Transistor (DSP) Cell for Megabit Dram", Tsukamoto et al., *IEDM*, 1987, pp. 328-331.
"An 0.8 Micrometer CMOS Technology for High Performance Logic Applications", Chapman et al., *IEDM*, 1987, pp. 362-365.
"A 1M Sram with Full CMOS Cells Fabricated in a 0.7 Micrometer Technology", de Werdt et al., *IEDM*, 1987, pp. 532-535.
"VLSI Local Interconnect Level Using Titanium Nitride", Tang et al., *IEDM*, 1985, pp. 590-593.
"Novel Submicron MOS Devices by Self-Aligned Nitridation of Silicide (Sanicide)", Kaneko et al., *IEDM*, 1985, pp. 208-211.

*Primary Examiner*—Brian E. Hearn
*Assistant Examiner*—C. Chaudhari
*Attorney, Agent, or Firm*—Edward D. Manzo

[57] ABSTRACT

In a multi-layered integrated memory circuit, a method for using sacrificial layers and insulating "sticks" is disclosed to provide a contact between two layers, where the contact does not short to an intervening layer. This invention provides this with minimal extra processing by using sacrificial layers with appropriate etch and etch stop properties. As these layers are etched, additional layers which alternate in the same conducting/insulating pattern are exposed. Each etch stops on either a conductive or insulative layer. A contact layer may then be deposited which connects the uppermost capacitor plate to the pass transistor of the memory cell.

19 Claims, 4 Drawing Sheets

METHOD FOR CREATING SELF-ALIGNED, NON-PATTERNED CONTACT AREAS AND STACKED CAPACITORS USING THE METHOD

FIELD OF THE INVENTION

This application is related to my previously filed application entitled "IMPROVED TRENCH CAPACITOR FOR LARGE SCALE INTEGRATED MEMORY" filed June 22 1990 and having U.S Ser. No. 07/542,573, which is incorporated herein by reference. Accordingly, the filing data of that earlier co-pending application applies to this specification pursuant to the terms of 35 U.S.C. 120.

This invention relates generally to fabrication of integrated memory circuits and more specifically to a method and apparatus for creating a self-aligned, non-patterned contact area on an integrated circuit, and a stacked capacitor for an integrated circuit memory using the self-aligned contact.

BACKGROUND OF THE INVENTION

One of the goals of very large scale integration is to increase the amount of memory available on an integrated memory circuit while maintaining or decreasing the overall size of the integrated circuit. Dynamic Random Access Memory (DRAM) capacity has increased from 64K up through the 1 megabyte level and beyond on one chip. As the size of the memory capacity increases, the concentration of memory cells increases. Various techniques have been utilized to squeeze as many memory cells onto a chip as possible.

Three basic types of memory cells are currently used. First, the flat memory cell, as its name implies, uses a flat capacitor (built with its plates parallel to the surface of the substrate) and transistor for each memory cell. The disadvantage of this configuration is that as the surface area available for each capacitor decreases, the capacitance, or the ability to hold the charge representing the memory unit, decreases.

Second, trench capacitors have been used. A trench capacitor utilizes a well formed into the substrate, whereby the electrical charge representing the memory unit is stored on a capacitor between the heavily doped wall of the trench and the electrode in the trench. One major drawback of this type of capacitor is leakage of the charge from the trench wall to adjacent capacitors if the substrate is not heavily doped or the trench cells are too close together.

Third, stacked capacitors have been used. A stacked capacitor is a capacitor which can, because of its construction, overlap or "stack" on top of other elements of the cell (i.e., the word line or isolation layer). The disadvantage of this cell is that as the surface area is reduced the capacitor decreases.

One solution that has been proposed to these various problems is to fabricate two capacitors one on top of the other using flat capacitor fabrication techniques. This structure can utilize the capacitance of the capacitors in parallel ($C_{total} = C_1 + C_2$), whereby the total surface area of the capacitor may be made smaller than a one-capacitor memory cell, and have the same or greater capacitance. As a result, integration may take place on a larger scale.

One major problem with multiple capacitors is that it is very difficult to connect the upper capacitor plate to the pass transistor which controls access to the memory cell. This is true, in general, for connecting one level to another in all multi-layer structures. In standard processing, an insulating layer is normally placed on top of the upper capacitor plate. Small holes are etched to both the upper plate and the pass transistor (on the order of one square micron each) and a layer of metal would be deposited to connect the two layers.

Making this type of connection is very space consuming, and the closest the metallic contact layer may approach the edge of the memory cell or pass transistor gate is defined by the alignment tolerances and the etch tolerances of the system used in manufacture. Therefore, a multiple capacitor memory cell has not heretofore been practical.

It is therefore a general object of this invention to overcome the above problems.

A further object of this invention is to provide a memory cell with high capacitance in a small area.

A further object of this invention is to provide a contact region with a minimal amount of addition processing.

Yet a further object of this invention is to provide a method of fabricating a multilayered integrated circuit which provides a contact from an upper layer to a lower layer in the circuit without shorting to any conductive layers in between.

SUMMARY OF THE INVENTION

The present invention relates to the use of sacrificial layers and insulating "sticks" to provide a contact between two layers, where the contact does not short to an intervening layer. This invention provides this unique ability with minimal extra processing by forming alternating layers with conducting and insulating properties. As these layers are etched, additional layers which alternate in the same conducting/insulating pattern are added. Each etch stops on either a conductive or insulative layer. A contact layer may then be deposited which connects the uppermost capacitor plate to the pass transistor of the memory cell.

BRIEF DESCRIPTION OF THE DRAWINGS

The invention, together with its objects and the advantages thereof, may best be understood by reference to the following detailed description taken in conjunction with the accompanying drawings of which.

DETAILED DESCRIPTION OF THE PREFERRED EMBODIMENT

Figure 1:
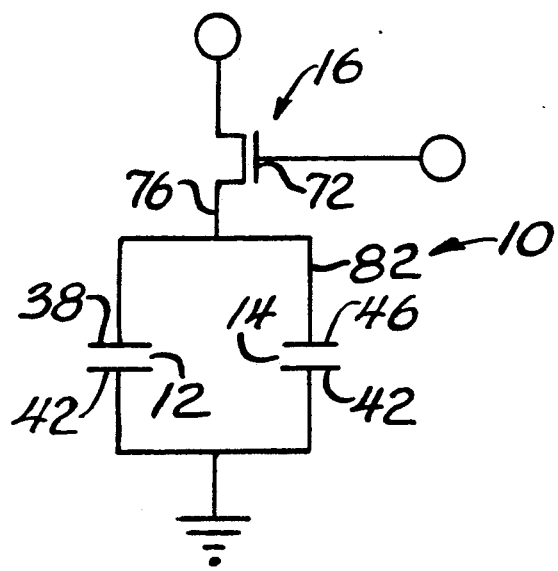
FIG. 1 is a circuit diagram of a memory cell constructed according to the preferred embodiment of the present invention.

The preferred embodiment of this invention will be described in connection with the simplistic memory cell model of FIG. 1. It is to be understood that the capacitor of this invention may be modified to suit the requirements of other memory circuits without departing from the scope of this invention. In FIG. 1, a memory cell is generally denoted by the number 10. Memory cell 10 generally comprises two capacitors 12 and 14 and a pass transistor 16. Capacitors 12 and 14 are configured to have a first plate coupled to ground and a second plate coupled to a drain of the pass transistor 16. A source and gate of the pass transistor 16 are coupled to the bit line and word line, respectively, as is known in the art. The transistor 16 may comprise an enhancement or depletion type FET or other switching device.

Figure 2:
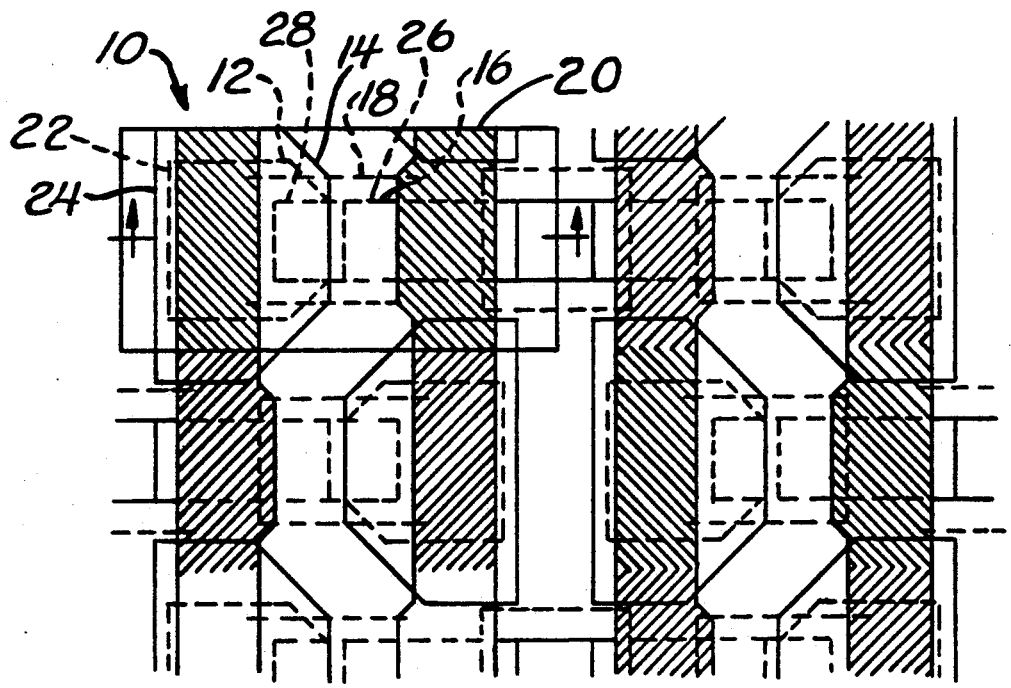
FIG. 2 is a plain view of a region of memory cells built according to the preferred embodiment of this invention.

Turning now to FIG. 2, a plan view is shown of a portion of memory array constructed according to the preferred embodiment of this invention, showing four complete memory cells 10. The array of course contains millions of such cells, and FIG. 2 is merely illustrative. Each memory cell 10 in this array includes capacitors 12 and 14 and a pass transistor 16, constructed according to the preferred embodiment of this invention. Also shown in FIG. 2 are each memory cell's associated bit lines or local interconnect 18 and word lines 20. A cell implant cut is shown at 22 with a cell capacitor definition shown at 24 over cell implant cut 22. The cell capacitor definition 24 is generally defined by mask at M-1, as will be described below. 26 generally denotes an opening in a mask M-2, as will also be described below. Pass transistor 16 is generally defined by the intersection of 26 and 20. The cell capacitors are defined by 24. Feature 18 is a conductive layer which connects the memory cell capacitor 14 to the source/drain of transistor 16. Details of this connection are described below.

Figure 3:
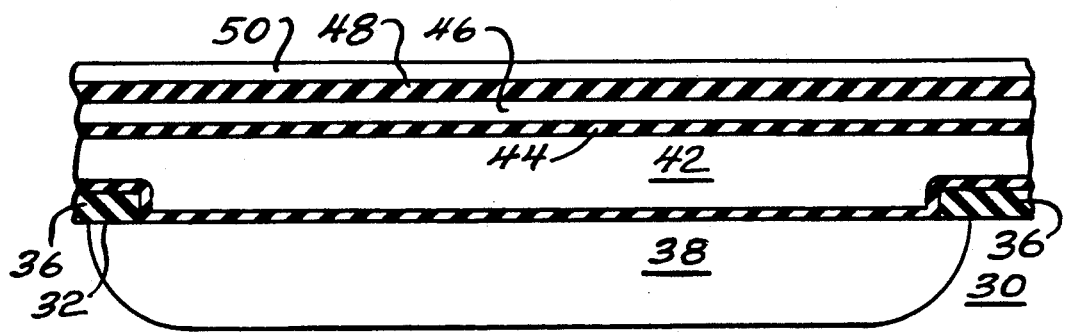
FIG. 3 is a representational cross-section taken along line 3—3 of FIG. 2 of an intermediate step of construction of the preferred embodiment of this invention.

Referring now to FIG. 3, an illustration of the preferred embodiment of this invention is shown after several steps of processing are substantially complete. The construction of the preferred embodiment of this invention begins with a substrate or wafer 30 formed preferably of single crystal silicon that is P doped, as known in the art. Other substrates can be used, and the P doping could be varied.

A field shield will then be formed on the upper surface 32 of substrate 30 in this embodiment. The field shield may be generally constructed according to the method described in U.S. Pat. No. 4,570,331 to S. Sheffield Eaton, Jr. et al., or variations thereof. Accordingly, a field shield implant is performed in this embodiment on the upper surface 32 of the substrate 30, which adjusts the threshold voltage of both the active pass transistor 16 and the field shield isolation transistor. The field shield itself preferably comprises two layers. First, a field shield oxide layer 36 is established, preferably by being grown directly on the substrate in a 920° Celsius wet $O_2$ atmosphere to a thickness of approximately 62 nm.

Next, a photoresist (not shown) is applied to pattern a cell implant cut 38, as is known in the art. The cell implant cut 38 is implanted with phosphorous with a dose of approximately $5 \times 10^{14}$ at 60 KeV to make it conductive. This step establishes the first or lower plate of the first or lower capacitor in the preferred embodiment, through the field shield oxide 36. The photoresist is then stripped. The field shield oxide layer 36 is then etched as shown in FIG. 3, so that it is self-aligned to the edge of the cell implant cut 38.

An insulative first capacitor dielectric layer 40 is deposited over the structure. In the preferred embodiment, the first capacitor dielectric layer comprises silicon nitride at a thickness of between 0.016 to 0.020 microns is deposited at a temperature of 720° C. in an $SiH_2C_{12}/NH_3$ atmosphere. The first capacitor dielectric layer is then sealed by oxidizing the structure thus formed at 920° C. in an $HCl/O_2$ atmosphere for 80 minutes. A field shield polysilicon layer 42, doped to preferably greater than $10^{20}/cm^3$ with phosphorus is then deposited via means known in the art over dielectric layer 40 to a thickness of approximately 0.15 micron in this preferred embodiment.

The field shield will be common to all capacitors and will be coupled everywhere to ground in the preferred embodiment by being coupled to VSS somewhere. However, the field shield may be tied to another source of stable electrical potential on the memory circuit. The field shield provides isolation of the memory cell from other memory cells. The field shield also acts as a common or middle plate of the memory cell capacitor in this embodiment.

Next, an insulative second cell dielectric layer 44 is deposited or grown over the field shield. Dielectric 44 preferably comprises silicon nitride, preferably deposited via chemical vapor deposition to a thickness of approximately 0.018 microns. The cell dielectric 44 may vary in composition and/or thickness according to the desired capacitance of the capacitor device, as is known in the art.

Next, in the preferred method an oxidation step is performed which oxidizes the cell dielectric layer 44 to repair any gaps in the nitride dielectric layer and to form a silicon oxide layer in order to reduce the conductivity of the stack.

Next, a conductive second plate layer 46 is formed by means known in the art. In this embodiment, second plate layer 46 preferably comprises conductive doped polysilicon deposited b chemical vapor deposition to a thickness of approximately 0.15 microns, preferably in an ASM vertical furnace using disilane ($Si_2H_6$) and phosphene ($PH_3$) which produces a phosphorus doping of greater than $10^{20}/cm^3$ in the polysilicon. Second plate layer 46 may be connected to source/drain of the pass transistor 16 which will be described below, in connection with FIGS. 7 and 8.

Next, an insulative stop oxide layer 48 is formed, preferably by deposition. Stop oxide layer 48, as its designation implies, comprises a sacrificial layer that will be used as described below in connection with FIGS. 7 and 8. Stop oxide layer 48 in this embodiment may be an insulating material comprising silicon dioxide deposited to a thickness of approximately 60 nm.

The next layer of this embodiment preferably comprises a stop polysilicon layer 50. However, stop polysilicon layer 50 may not be necessary in other embodiments, depending upon the desired final structure. Stop polysilicon layer 50 comprises undoped polysilicon, deposited to a thickness of approximately 100 nm.

Thus it will be seen that in the preferred embodiment as thus far described, a stack capacitor structure is created with layers alternately of conductive and insulative material.

Figure 4:
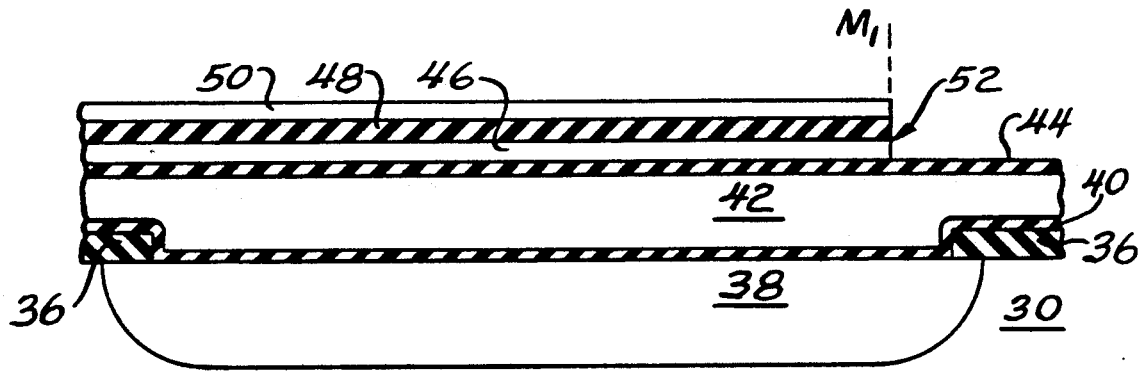
FIG. 4 is a representational cross-section of a subsequent step to FIG. 3, wherein certain layers have been etched to form a first step at a location or mask edge M-1.

Turning now to FIG. 4, a stacked capacitor structure constructed according to the preferred embodiment of the present invention is shown after further processing. It will be seen from FIG. 5 that the alternating layers will be defined at two locations, M-1 and M-2.

A first step 52 (FIG. 4) which corresponds to 24 (FIG. 2) is formed adjacent to the edge of the cell implant cut. In the preferred method, a mask is formed of photoresist (not shown) as is known in the art over the structure of FIG. 3, wherein M-1 in FIG. 4 denotes the edge of the mask. Stop polysilicon layer 50 is etched using an anisotropic dry etch well known in the art that will stop on oxide 48. Stop oxide layer 48 next is etched using an anisotropic dry etch that will stop on polysilicon, which in this embodiment comprises second plate polysilicon layer 46. Polysilicon layer 46 is then etched via means essentially similar to that used to etch stop polysilicon layer 50 such that the etch will stop on the silicon nitride of the second cell dielectric layer 44, thus forming the first "step" 52. The photoresist used to form the mask is then stripped. The structure of FIG. 4 results.

Figure 5A:
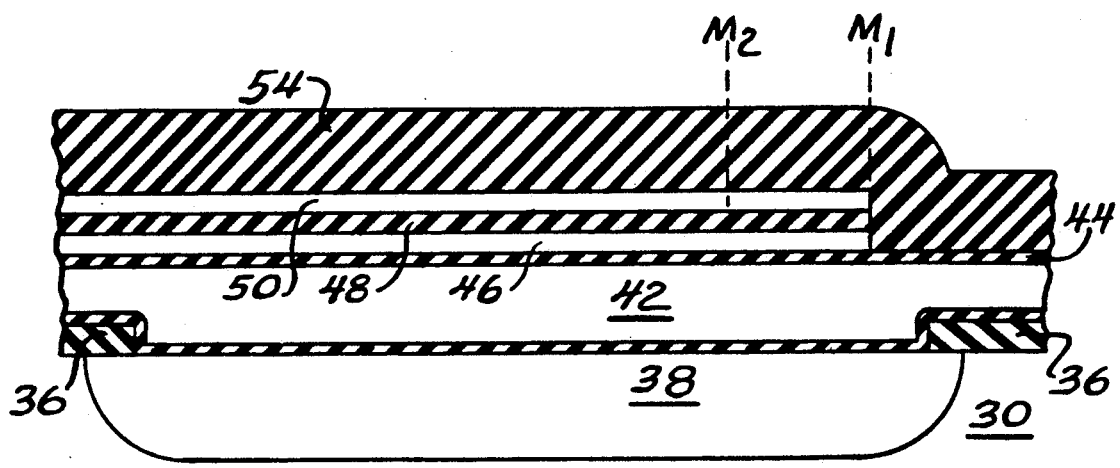
FIGS. 5A, 5B, and 5C are representative sectional illustrations that show the addition of a further insulative layer and construction therefrom of a second step at a second location or mask edge M-2. The shaded areas in FIGS. 5B and C represent material to be etched away during processing described in the specification.

Turning now to FIG. 5A, an oxide may then be grown or, as in the preferred embodiment, deposited by means known in the art to a thickness of approximately 0.2 microns. The structure thus created may then be subjected to densification by standard techniques, as described above. The resulting structure is shown in FIG. 5.

Figure 5B:
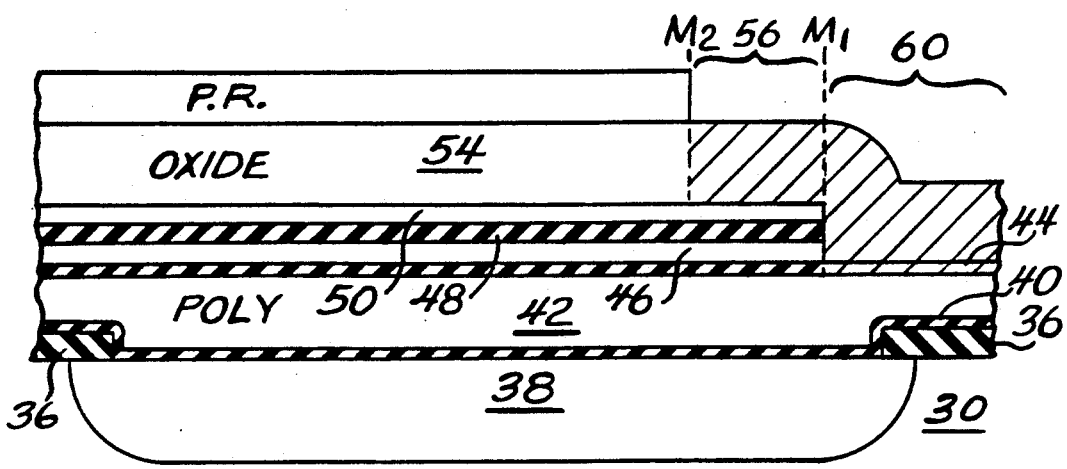

The structure created in FIG. 5 is further masked and etched. First, oxide layer 54 is masked with photoresist so that the stacked capacitor layers are covered with photoresist that extends to line M-2, which denotes the edge of the mask layer 26 (FIG. 2). The distance from M-2 to M-1 is approximately 0.7 microns in the preferred embodiment. Next an etch of the exposed portions of oxide layer 54 is performed, stopping on the stop polysilicon layer 50 (see FIG. 5) in a first region 56 between lines lines M-1 and M-2. This etch also etches in a second region 60 (adjacent to region 56) through oxide 54 and then through the second cell dielectric 44, stopping on the top surface of field shield polysilicon layer 42. FIG. 5B shows by lining the dielectric being etched in this step. The photoresist is then stripped. Thus, it will be seen that a second step (at M-2) has now been formed between the first step (at M-1) and the stacked capacitors at this time, the upper layer of each step is polysilicon (50,42).

Figure 5C:
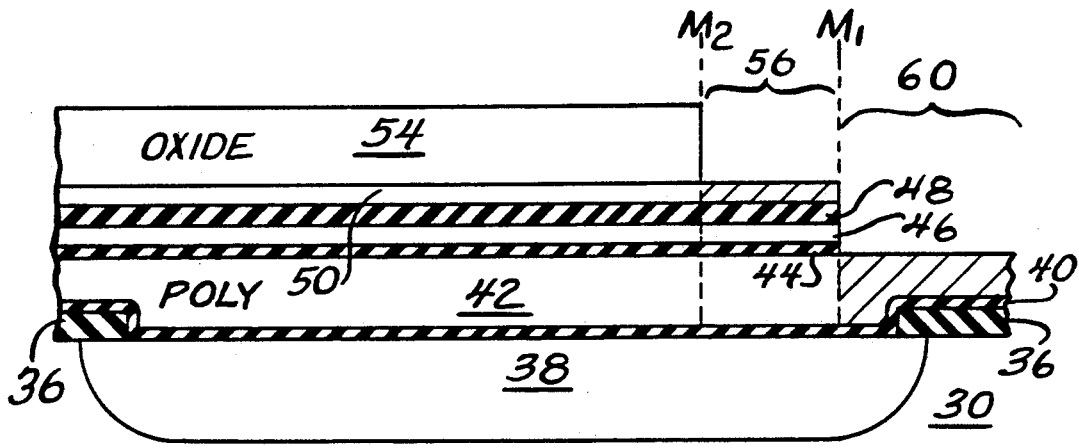

The next operation is preferably an anisotropic plasma polysilicon etch, which etches two different polysilicon members simultaneously in the preferred embodiment. Referring to FIG. 5C, one polysilicon member that is etched is the stop polysilicon layer 50 exposed between lines M-1 and M-2. The other is the exposed field shield polysilicon layer 42 to the right of line M-1. FIG. 5C shows in diagonal lines the material etched in this step. The etch stops on oxide 48 and first cell dielectric 40. The structure of FIG. 6 results.

Figure 6:
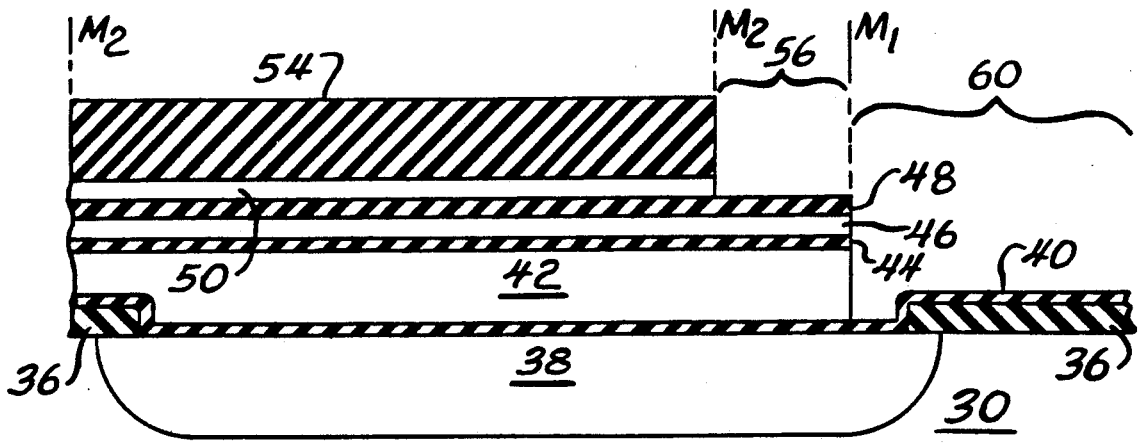
FIG. 6 is a representational cross-section of a subsequent step to FIG. 5 illustrating a multi-layered or stepped structure according to one aspect of this invention.
Figure 7A:
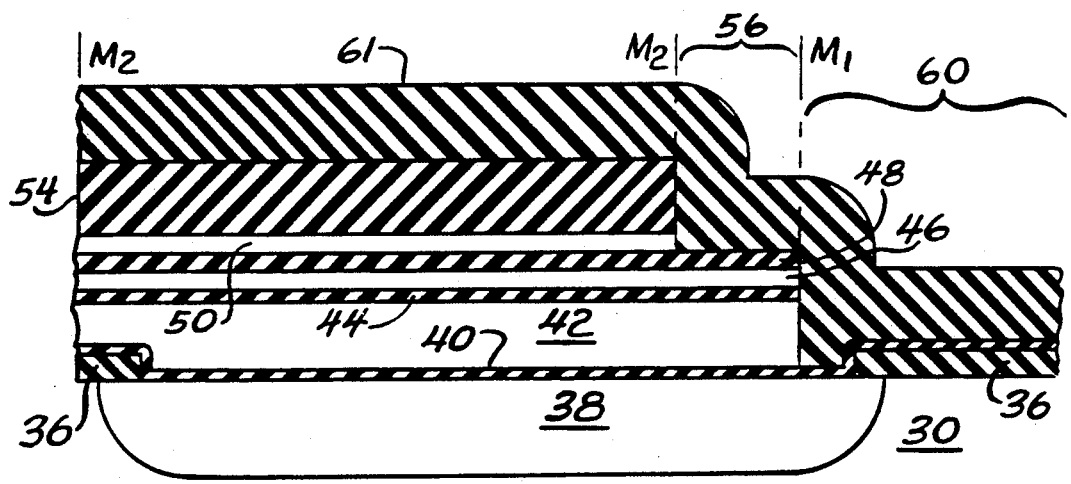
FIG. 7A shows the structure of FIG. 6 with a layer of oxide added and FIG. 7B is a representational cross-section of a step subsequent to FIG. 6 illustrating the position of insulating "sticks" used in the invention, and representing a completed multi-layer self-aligned, non-patterned contact area.
Figure 7B:
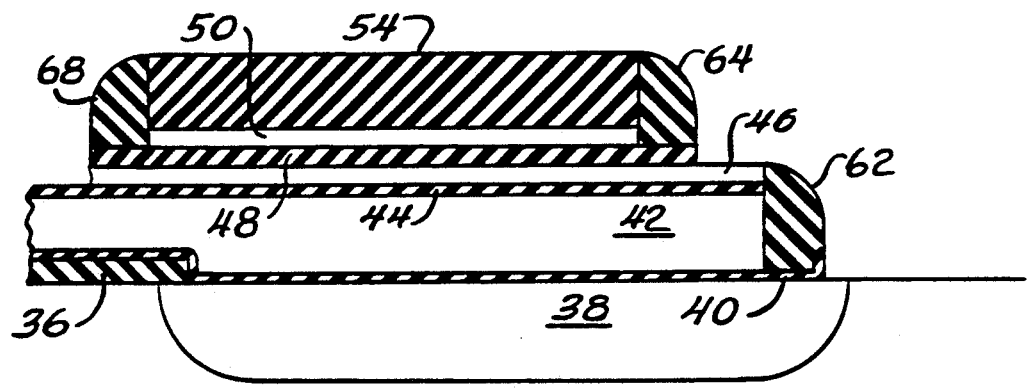

Turning now to FIG. 7A, a further oxide layer 61 may be deposited by means known in the art over the entire structure formed in FIG. 6 to a thickness of 0.20 microns, illustratively. The further oxide layer 61, the stop oxide layer 48, the dielectric 40, and the oxide 36 may then be anisotropically etched using a low-silicon-damage etch, so that spacer sticks 62, 64 and 68 are left at the steps created at M-1 and M-2, as shown in FIG. 7B. Thus, each oxide spacer stick 62, 64 and 68 has a substantially vertical sidewall nearest the trench, i.e., at M-1 and M-2, respectively. The structure thus created may again be subjected to densification depending on the type of oxide deposition used. In the preferred embodiment, densification is not needed because the oxide used is deposited at a high temperature on the order of 800° C. The resulting structure is shown in FIG. 7B.

The body of oxide stick 62 meets and insulates the outer edges of first dielectric layer 40, field shield 42, second dielectric layer 44 and upper plate layer 46, all at the "first step" M-1. Between the first and second steps, a lateral expanse of second plate 46 is exposed; the remaining structure is covered by oxide, except for part of the substrate 30. The oxide sticks 64 and 68 meet and adjoin the outside edges of polysilicon layer 50, as well as oxides 54 and 48, as shown in FIG. 7

Figure 8:
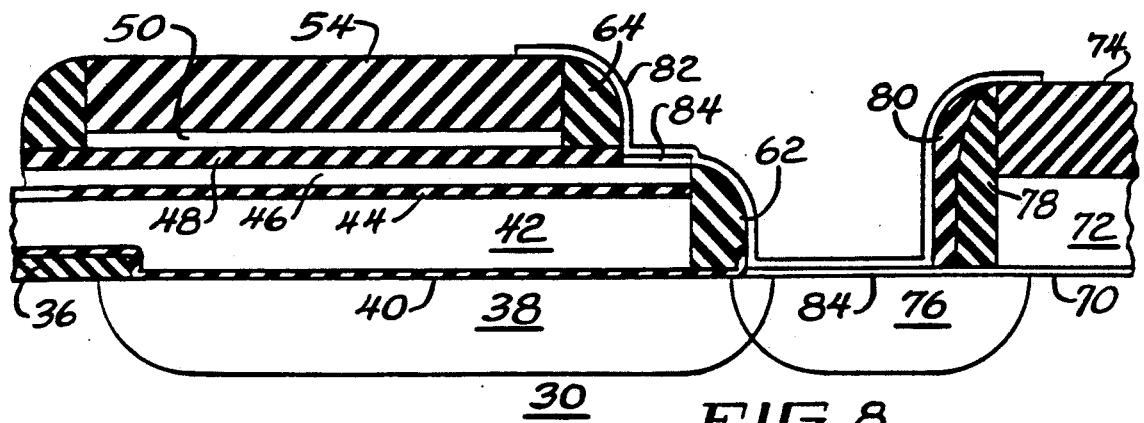
FIG. 8 is a representational cross-section of a stacked capacitor memory cell constructed according to this invention, showing detail of the pass transistor.

Turning now to FIG. 8, a gate oxide layer 70 is grown or otherwise established on exposed silicon to a thickness of 20 nm. Next, a gate polysilicon layer 72 is deposited over the entire surface to a thickness of approximately 0.2 microns. Next, a gate poly oxide layer 74 is deposited to a thickness of approximately 0.2 microns over gate polysilicon layer 72. This structure is then densified at 920° C. for 10 minutes in a dry $O_2$ atmosphere in the preferred embodiment.

The structure thus created is masked with a photoresist and etched. First, gate poly oxide layer 74 is etched, stopping on the polysilicon layer 72; the photoresist is then stripped and the gate polysilicon layer 72 is etched, stopping on gate oxide 70.

Next, a 50 nm first spacer oxide layer (not shown) is deposited over the surface of the structure. A lightly doped drain (LDD) region 76 is then defined via masking. The LDD region 76 in the preferred embodiment of this invention is an N+ doped region which results from implanting phosphorus at a dose of approximately per $cm^2$ and an energy level of 60 keV through the first spacer oxide layer. A second spacer oxide layer (not shown) is then deposited to a thickness of approximately 0.1 micron. Both spacer oxide layers are then etched anisotropically leaving sticks 78 and 80 as shown in FIG. 8.

Thus, at this point in the process, a gate electrode has been created with an insulated side wall (facing the steps at M-1 and M-2). Between the gate electrode and the steps is an exposed upper surface of the substrate 30, in which an LDD implant has been done.

Source-drain regions for both n-channel and p-channel transistors are then formed on other regions of the wafer using methods which are known in the art.

Continuing with FIG. 8, a 20 nm titanium layer is next deposited over the entire structure. A titanium nitride layer 82 may then be formed over the non-silicon regions while a titanium silicide layer 84 is formed under the titanium nitride where the titanium contacts polysilicon 46 or substrate 30. A 50 nm titanium nitride layer is then sputtered onto the structure. A masking silicon nitride ($Si_3N_4$) is then deposited by chemical vapor deposition, to a thickness of 50 nm. The structure is masked with photoresist covering area 18 (FIG. 2) corresponding to the extent of 82 (FIG. 8). Next, the exposed areas of the silicon nitride are etched with a dry, isotropic plasma etch, stopping on the underlying titanium nitride layer. The photoresist layer is stripped and the silicon nitride is used as a mask while etching the exposed portions of the titanium nitride layer, stopping on the titanium silicide layer 84.

By forming a memory cell according to the preferred embodiment of this invention, sticks 62, 64, 78 and 80 prevent the contact/barrier layer or region of titanium nitride (which is conductive) from contacting and hence electrically connecting to certain other conductive layers—specifically the field shield layer which is tied to ground and the gate polysilicon layer 72 which is the word line 20. However, the titanium silicide and titanium nitride operate to couple the second capacitor plate electrode 46 (which was exposed between the two steps) to the source/drain region 76. This corresponds to FIG. 1 where the upper capacitor plates are coupled to the source/drain of FET 16.

Consequently, the contact/barrier layer may be deposited without etching contact windows. By using sacrificial layers formed into steps in combination with insulating sticks, a self-aligned contact layer has thus been established.

Next, nitride may be deposited to a depth of approximately 0.03 microns. A BPSG layer may then be deposited to a thickness of approximately 0.6 microns over the entire structure, as is commonly done in the art. Bit lines 16, as are known in the art, are then formed.

Although the present invention has been described herein in terms of the preferred embodiment, it is envisioned that the scope and spirit of the present invention encompasses such changes and minor alterations as would normally be apparent to one skilled in the art and familiar with teachings of this specification.

I claim:

1. In the fabrication of a multi-layer integrated circuit, a method for establishing an electrical contact from one conductive layer to an underlying conductive layer or region of said multi-layer integrated circuit to which contact is to be made, comprising the steps of:
   forming a plurality of layers on top of each other, including the one conductive layer to which contact is to be made;
   etching said plurality of layers to expose the upper surface of one of said layers at a first elevation and to expose the upper surface of another one of said layers or a region at a second elevation, thereby to form a step between said first and second elevations, said step having a sidewall;
   establishing an insulating layer on said exposed upper surfaces and said sidewall;
   etching to remove insulative material, including at least part of said insulating layer, and to expose an upper surface portion of said one conductive layer to which contact is to be made and to expose an upper surface portion of said underlying conductive layer or region to which contact is to be made but leaving a stick of insulation on said sidewall of said step thereby to insulate exposed sidewall surfaces of the layers which form said step from electrical contact with said one conductive layer to which contact is to be made; and
   forming an electrically conductive layer over said upper surface portions and said stick thereby to couple said one layer to which contact is to be made electrically to said another layer or region to which contacts is to be made without coupling either of them to any intermediate conductive ones of said plurality of layers.

2. The method of claim 1 wherein said step of forming a plurality of layers includes forming a plurality of alternating layers of conductors and insulators.

3. The method of claim 2 wherein said plurality of alternating layers of conductors and insulators includes sacrificial layers.

4. The method of claim 1 further including etching said electrically conductive layer.

5. The method of claim 2 wherein said first-named etching includes (a) forming a sidewall of a first conductor layer, to which electrical contact is not to be made, and (b) exposing the upper surface of a second conductor layer, to which the contact is to be made, as the top of said step, the second conductor layer being located above the first conductor layer;
   said sidewall of the first conductor layer being protected by the stick of insulation as a result of said second-named etching.

6. The method of claim 5 including
   forming a first substrate conductive region,
   exposing an upper surface of the first substrate conductive region adjacent to said stick of insulation,
   forming said electrically conductive layer to coupled said second conductor layer to said first substrate conductive region.

7. The method of claim 6 wherein said first substrate conductive region is a source or drain region of a transistor, and wherein said first conductor layer comprises one plate of a first capacitor, wherein said second conductor layer is another plate of said capacitor.

8. The method of claim 7 further comprising forming a second substrate conductive region below said alternating layers, said step of forming alternating layers including forming an insulator between said first conductor layers and said second substrate conductor region thereby forming a second capacitor, said first conductor layer forming a plate electrode for both said first and second capacitors,
   said first and second substrate conductive regions being formed so that they are electrically coupled within the substrate.

9. The method of claim 8 wherein said first conductor layer is formed as a field plate layer for isolation of memory cells on the integrated circuit.

10. A method of fabricating an integrated circuit memory cell having a capacitor and an interconnected transistor within and upon a substrate comprising the steps of:
    forming a first substrate conductive region extending from an upper surface of the substrate into the substrate;
    forming a first insulator layer upon the upper surface of the substrate, over the first substrate conductive region;
    forming a first insulator layer upon the first insulator layer;
    forming a plurality of alternating layers of insulator and conductor over said first conductor, including a second insulator layer and a second conductor layer;
    forming a step by etching said plurality of layers and said first conductor layer to expose an upper surface portion on one of said alternating layers at one elevation and to expose the upper surface of another layer or region at a different elevation, thereby to forming a step between said elevations, said step including a sidewall of the first conductor layer the second conductor layer, and the insulator layer therebetween;

establishing a stick of insulation on said sidewall of said first conductive layer thereby to insulate it;

establishing a transistor having a second substrate conductive region adjacent to and electrically coupled through the substrate to the first substrate conductive region;

exposing an upper surface of the second substrate conductive region adjacent to said stick of insulation; and forming an electrically conductive layer over said upper surface of the second substrate conductive region, over said insulation stick, and over the upper surface of the second conductor layer thereby to couple said second conductor layer electrically to said second substrate conductive region without coupling either of them to the first conductor layer;

whereby a first capacitor is formed using the first substrate region and the first conductor layer as plates, and a second capacitor is formed using the first conductor layer and the second conductor layer as plates, with the second substrate region coupled to the second capacitor via the electrically conductive layer and coupled to the first capacitor via the substrate.

11. The method of claim 10 wherein said first conductor layer is formed as a field plate.

12. The method of claim 11 further comprising coupling said first conductor layer to a reference potential.

13. The method of claim 10 wherein said forming a step includes:

etching at a first mask location (M1) to create a sidewall (52) in the second conductor layer and to expose part of the upper surface of the second insulator layer (44); THEN etching the exposed part of the second insulator layer (44) to expose the upper surface of part of the first conductor layer (42); then etching the exposed part of the first conductor layer (42) to expose part of the first insulator layer (40); thereafter etching through the exposed part of the first insulator layer (40); and thereafter adding said layer of electrically conductive material (82).

14. The method of claim 13 wherein said step of forming alternating layers includes forming a third insulator layer (48) over the second conductor layer and a third conductor layer (50) over the third insulator layer;

wherein said forming a step further comprises exposing the upper surface of the third conductor layer (50) and forming the sidewall through said layer (50), said third insulator layer (48), and said second conductor layer (46) at said first mask location (M1).

15. The method of claim 14 wherein said forming a step further comprises:

adding a fourth insulator layer (54) after forming said sidewall at said first mask location (M1) but before etching the second insulator layer; then defining a second mask location (M2); then in a single step of etching insulators, (a) etching through said fourth insulator layer (54) and stopping on the upper surface of said third conductor layer (50) in the region between said first mask location (M1) and said second mask location (M2), and (b) etching through said fourth insulator layer and through said second insulator layer (44) on the other side of said first mask location (M1), stopping on the upper surface of the first conductor layer (42); then in a single step of etching conductors (a) etching through the exposed portion of the third conductor layer (50), stopping on the third insulator layer (48) on one side of the first mask location, and (b) etching through the exposed portion of the first conductor layer (42), stopping on the first insulator layer (40) on the other side of the first mask location.

16. A method to fabricate an integrated circuit capacitor, comprising the steps of:

forming a first capacitor plate in a substrate by establishing a first substrate conductive region extending from an upper surface of the substrate into the substrate;

forming a stack of alternating conductor and insulator layers on top of said first capacitor plate, including a conductor layer as a second capacitor plate insulated from the first substrate conductive region by one of said insulator layers and a conductor layer as a third capacitor plate located over but insulated from the second capacitor plate by another one of said insulator layers;

etching to expose a portion of the upper surface of said third capacitor plate at a first elevation higher than the upper surface of the substrate and to form a step with a sidewall through the conductor layers forming said second and third capacitor plates;

establishing a stick of insulation on the sidewall of the step;

exposing a portion of the substrate adjacent to said step; and forming an electrically conductive layer over said exposed upper surface portion of the third capacitor plate and over said stick of insulation thereby to couple said third capacitor plate electrically to the exposed portion of the substrate adjacent to the step without contacting the second capacitor plate, so that the first and third capacitor plates are coupled together electrically via said electrically conductive layer.

17. The method of claim 16 wherein etching to expose part of the upper surface of the third capacitor plate comprises exposing only a portion thereof and leaving other parts covered.

18. The method of claim 17 further comprising:

forming a second substrate conductive region communicating electrically with the first substrate conductive region;

said exposing a portion of the substrate adjacent to the step comprising exposing part of the upper surface of the second substrate conductive region, so that the third capacitor plate is coupled to the first capacitor plate via said electrically conductive layer and said second substrate conductive region.

19. The method of claim 18 wherein the method further includes forming a pass transistor coupled electrically to the capacitor, and wherein said second substrate conductive region comprises part of the pass transistor.

* * * * *